US006448547B1

(12) United States Patent
Johnson

(10) Patent No.: US 6,448,547 B1
(45) Date of Patent: Sep. 10, 2002

(54) METHOD FOR DETERMINING PHOTODIODE PERFORMANCE PARAMETERS

(75) Inventor: Jeffery L. Johnson, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 5 days.

(21) Appl. No.: 09/769,094

(22) Filed: Jan. 24, 2001

(51) Int. Cl.$^7$ ................................................ H01J 40/14
(52) U.S. Cl. ............................... 250/214 R; 250/201.1; 324/765
(58) Field of Search ............................ 250/200, 214 R, 250/214 AG, 201.1, 214 AL, 214 B; 327/514; 324/765, 767; 315/149; 702/108, 116

(56) References Cited

U.S. PATENT DOCUMENTS 5,159,262 A * 10/1992 Rumbaugh et al. ......... 324/765
5,917,639 A * 6/1999 Ushirozawa ......... 250/214 AG

OTHER PUBLICATIONS

Limperis, Thomas and Mudar, Joseph, "Detectors," *The Infrared Handbook*, rev'd ed., Wolfe, William L. and Zissis, George J., eds. (Infrared Information Analysis (IRIA) Center, Environmental Research Institute of Michigan, 1985), Chapter 11, pp. 3–104.

Willardson, R.K. and Beer, Albert C., eds. (New York: Academic Press, 1981), *Semiconductors and Semimetals*, vol. 18, Photovoltaic Infrared Detectors, Chapter 6, pp. 201–307.

Vincent, John David, *Fundamentals of Infrared Detector Operation and Testing*, (New York: John Wiley & Sons 1990), "Detector Types, Mechanisms, and Operation", Chapter 2, pp. 25–80.

* cited by examiner

*Primary Examiner*—Kevin Pyo
(74) *Attorney, Agent, or Firm*—N. Stephan Kinsella

(57) ABSTRACT

One or more photodiode performance parameters for a photodiode are determined by first determining four data points Iph1, Voc1, Iph2, and Voc2, where Iph1 is a first short-circuit current, and Voc1 is a first open-circuit voltage, for the photodiode under a first illumination condition, and Iph2 is a second short-circuit current, and Voc2 is a second open-circuit voltage, for the photodiode under a second illumination condition. Then, at least one photodiode performance parameter for the photodiode is determined as a function of said four data points.

32 Claims, 4 Drawing Sheets

FIG. 1 100 PRIOR ART

METHOD FOR DETERMINING PHOTODIODE PERFORMANCE PARAMETERS

BACKGROUND OF THE INVENTION

1. Field of the Invention

This invention pertains to methods for manufacturing and testing semiconductor photodetector devices and, in particular, to methods for determining photodiode performance parameters including the dynamic impedance-area product $R_0A$, the external quantum efficiency $\eta$, the specific detectivity $D^*$, and other photodiode performance parameters.

2. Description of the Related Art

The following descriptions and examples are not admitted to be prior art by virtue of their inclusion within this section.

It is desirable to employ photodetectors to convert electromagnetic radiation, such as infrared (IR) radiation, into electrical signals. Such photodetectors may be used in a variety of applications, including thermal imaging and transmission of information using signals having infrared wavelengths. One type of photodetector is the junction photodetector, or photodiode, which has a semiconductor p-n junction that produces electrical current under illumination with electromagnetic radiation. When properly biased, therefore, the photodiode thus produces a current related in a known manner to the electromagnetic radiation incident thereon.

The performance of a photodiode may be predicted, to varying degrees of certainty, from various photodiode performance parameters. These performance parameters indicate various properties or characteristics of the photodiode, e.g. its electrical and optical properties. Performance parameters, e.g. normalized performance parameters, may be used as figures of merit, e.g. to compare the operation and characteristics of the device to certain thresholds or to other devices. The terms "figure of merit" and "performance parameter" may be used interchangeably herein.

It is desirable to determine these performance parameters, so as to be able to determine the overall performance of the photodiode or to determine its performance with respect to a particular characteristic. For example, knowledge of the photodiode's performance may be used for testing a fabricated photodiode during or after manufacture.

The most relevant performance parameters can be assessed according to the ideal diode equation, which for a device under illumination is given by:

$$I = I_0\left[\exp\left(\frac{qV}{nkT}\right) - 1\right] - Iph \text{ (A)}, \quad (1)$$

where I is the photodiode current, $I_0$ is the saturation current, V is the applied bias, n is the ideality factor, k is the Boltzman factor, and T is the operation temperature of the device. As can be seen, the total photodiode current consists of two components. The exponential term represents current contributions arising from diffusion processes in a semiconductor p-n junction, which is sometimes referred to as the dark current. The second term, Iph, is the photocurrent induced under illumination. Because the photocurrent Iph is related to the radiation incident on the photodiode, the total photodiode current I is also related to this radiation. Thus, measuring the current I can provide an indication of the intensity of local radiation.

Referring now to FIG. 1, there is shown a plot of the typical current verses voltage (I-V) curve 100 for an ideal photodiode (not shown). As shown in FIG. 1, under illumination, a zero bias photocurrent, Iph, flows at zero bias. Thus, the short-circuit current of a photodiode is equal to the induced photocurrent Iph. The open circuit voltage, Voc, is the point in forward positive bias where diffusion (dark) current equals the photocurrent so that no net current flows in the device.

The most relevant electrical performance parameter is the dynamic impedance-area product $R_0A$, which is defined as:

$$R_0A = A \cdot \left(\frac{dI}{dV}\right)^{-1}_{V=0} = \frac{nkTA}{qI_0} \text{ } (\Omega/\text{cm}^2), \quad (2)$$

where I is the total diode current from Eq. (1), q is the electron charge, A is the junction area of the device, and $R_0$ is the dynamic impedance at zero bias (i.e., the exponential derivative term in Eq. (2), which is multiplied by area A). This performance parameter embodies the essential elements of the diffusion process in the photodiode junction, and is an industry standard for comparing the electrical performance of photovoltaic structures. $R_0A$ is basically an indication of noise: the higher $R_0A$ is, the lower the noise. $R_0A$ is typically found by measuring the current as a function of voltage (I-V) and calculating the derivative, at V=0, according to Eq. (2).

The most relevant optical performance parameter used to characterize the performance of a photodiode is the external quantum efficiency $\eta$. The photocurrent induced in a photodiode of area A due to a background photon flux of $Q_{BK}$ can be expressed by:

$$Iph = \eta q A Q_{BK}, \quad (3)$$

The external quantum efficiency $\eta$ is a measure of electrical carriers collected per incident photon, and thus is an indication of signal, ranging from 1(best) to 0(worst). It is typically measured by exciting the device under test (DUT) with a known photon flux within a narrow band around a specified spectral wavelength $\lambda$, measuring the photocurrent, and computing the external quantum efficiency from Eq. (3).

As noted above, the performance of a photodiode is related to these two primary photodiode performance parameters. Specifically, the dynamic impedance-area product $R_0A$ is related to its electrical properties (noise), and the external quantum efficiency $\eta$ is related to its optical properties (signal), respectively.

Another important performance parameter is the specific detectivity, $D^*$, which is an overall photodiode performance parameter that indicates the signal-to-noise ratio (SNR) for the photodiode. $D^*$ is normalized with respect to detector area A and electrical bandwidth. Because the dynamic impedance-area product $R_0A$ is an indication of noise, and the external quantum efficiency $\eta$ is an indication of signal, $D^*$ may be computed from the primary performance parameters, $R_0A$ and $\eta$. Specific detectivity $D^*$ may be referred to herein as an overall performance parameter, because it is based on these two primary performance parameters.

The specific detectivity $D^*$ of a photodiode at zero applied bias is given by the expression:

$$D_\lambda^* = \frac{q\eta\lambda}{hc\sqrt{2\eta q^2 Q_{BK} + \frac{4kT}{R_0 A}}} \quad (4)$$

where h is Planck's constant and c is the speed of light. This overall performance parameter is the most widely accepted comparative parameter for specifying the detector's characteristics and performance. It can therefore be useful to accurately and easily determine the dynamic impedance-area product $R_0A$ and the external quantum efficiency $\eta$, so that specific detectivity may be estimated. Additionally, it is sometimes useful to determine the dynamic impedance-area product $R_0A$ and the external quantum efficiency $\eta$ parameters individually. For example, the external quantum efficiency $\eta$ of a given device may be compared to that of other devices or to a benchmark or threshold value. Background information regarding photodiodes and related performance parameters may be found in: Thomas Limperis & Joseph Mudar, "Detectors," Ch. 11 in *The Infrared Handbook*, rev'd ed., William L. Wolfe & George J. Zissis, eds. (Infrared Information analysis (IRIA) Center, Environmental Research Institute of Michigan, 1985); *Semiconductors and Semimetals*, vol. 18: *Mercury Cadmium Telluride*, R. K. Willardson & Albert C. Beer, eds. (New York: Academic Press, 1981), esp. ch. 6, "Photovoltaic Infrared Detectors," by M. B. Reine, A. K. Sood & T. J. Tredwell; and John David Vincent, *Fundamentals of Infrared Detector Operation and Testing* (New York: John Wiley & Sons, 1990), esp. ch. 2, "Detector Types, Mechanisms, and Operation."

In addition to $R_0A$, $\eta$, and $D^*$, the saturation current $I_0$, dynamic impedance at zero bias $R_0$, and ideality factor n may also be regarded as photodiode performance parameters, because they can be used as figures of merit to compare the performance of the photodiode. For example, the ideality factor n is an electrical performance parameter, and the saturation current $I_0$ is an electrical performance parameter embodying material characteristics. The dynamic impedance at zero bias $R_0$ is also an electrical performance parameter.

There are, however, difficulties in determining these photodiode performance parameters using standard techniques. First, for high-volume production of photodetectors, the amount of experimental data required to extract $R_0A$ from I-V measurements is prohibitively large and time-consuming to produce. Second, the electrical and optical properties are typically determined in separate measurements, e.g. the external quantum efficiency must be determined under controlled conditions.

Another, simpler approach, which is not admitted to be prior art by virtue of its inclusion within this section, is to employ an analysis using only two points on the characteristic I-V curve. One of these points is the short-circuit current (i.e., the current measured at zero bias), which is the simply the photocurrent, Iph, produced by the unspecified background photon flux present during the I-V measurement. The other point is the voltage under forward bias for which the diffusion current equals the photocurrent so that no net current flows in the device. When the total photodiode current I is zero, the open circuit voltage can be defined from Eq. (1) as:

$$V_{oc} = \frac{nkT}{q}\ln\left(\frac{Iph}{I_0}+1\right) \quad (5)$$

For unity ideality factors (n=1), the saturation current $I_0$ can also be determined from Eq. (1), as follows:

$$I_0 = \frac{Iph}{\left[\exp\left(\frac{qV_{oc}}{nkT}\right)-1\right]} \quad (6)$$

and $R_0A$ can be estimated directly by definition in Eq. (2).

There are two primary difficulties with this simple two-point analysis. First, the ideality factor, n, is unknown for a given device, and can range from one to three depending on the actual dark current mechanisms present. The assumption that n=1 is not always correct. Because the ideality factor is in the exponential, substantial errors can be made in the estimation of $R_0A$ if n is not known or imprecisely estimated. Second, the background flux present during the I-V measurement is often not controlled and can vary from measurement to measurement.

The foregoing drawbacks of conventional performance parameter measuring techniques can limit the ability to perform high throughput screening of photodetector performance at low cost. There is, therefore, a need for improved methods for quickly and accurately estimating the primary photodiode performance parameters, which are required for determining the specific detectivity.

BRIEF DESCRIPTION OF THE DRAWINGS

Other objects and advantages of the invention will become apparent upon reading the following detailed description and upon reference to the accompanying drawings in which.

Figure 1:
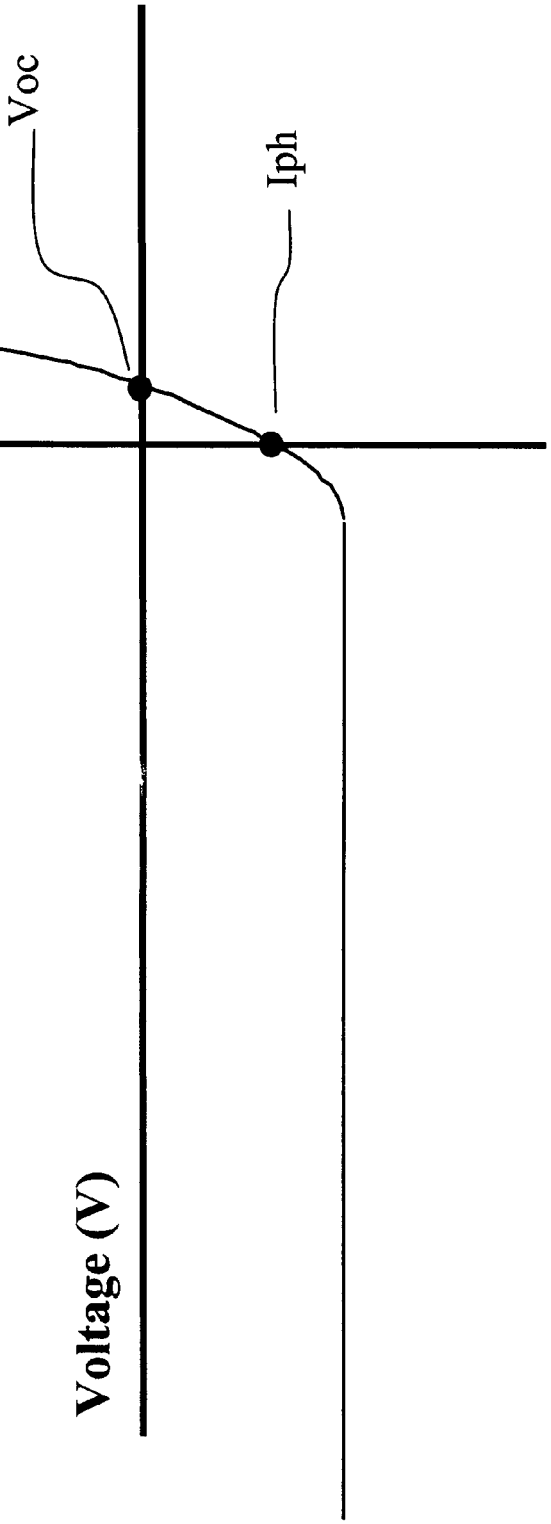
FIG. 1 is a plot of the typical current versus voltage (I-V) behavior of a photodiode.

While the present invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The present invention provides a method by which performance parameters for a photodiode can be efficiently determined, to a higher degree of accuracy than in conventional techniques, and in a single measurement session. As described in further detail below, in the present invention, two primary performance parameters—the dynamic-impedance-area product $R_0A$ and the quantum efficiency $\eta$—are uniquely determined by using only four measured data points. Further, an estimate of the specific detectivity $D^*$, another important, overall performance parameter, can be derived directly from the two primary performance parameters. Other photodiode performance parameters, such as saturation current $I_0$, dynamic impedance at zero bias $R_0$, and ideality factor n, may also be determined using these four data points.

Figure 2:
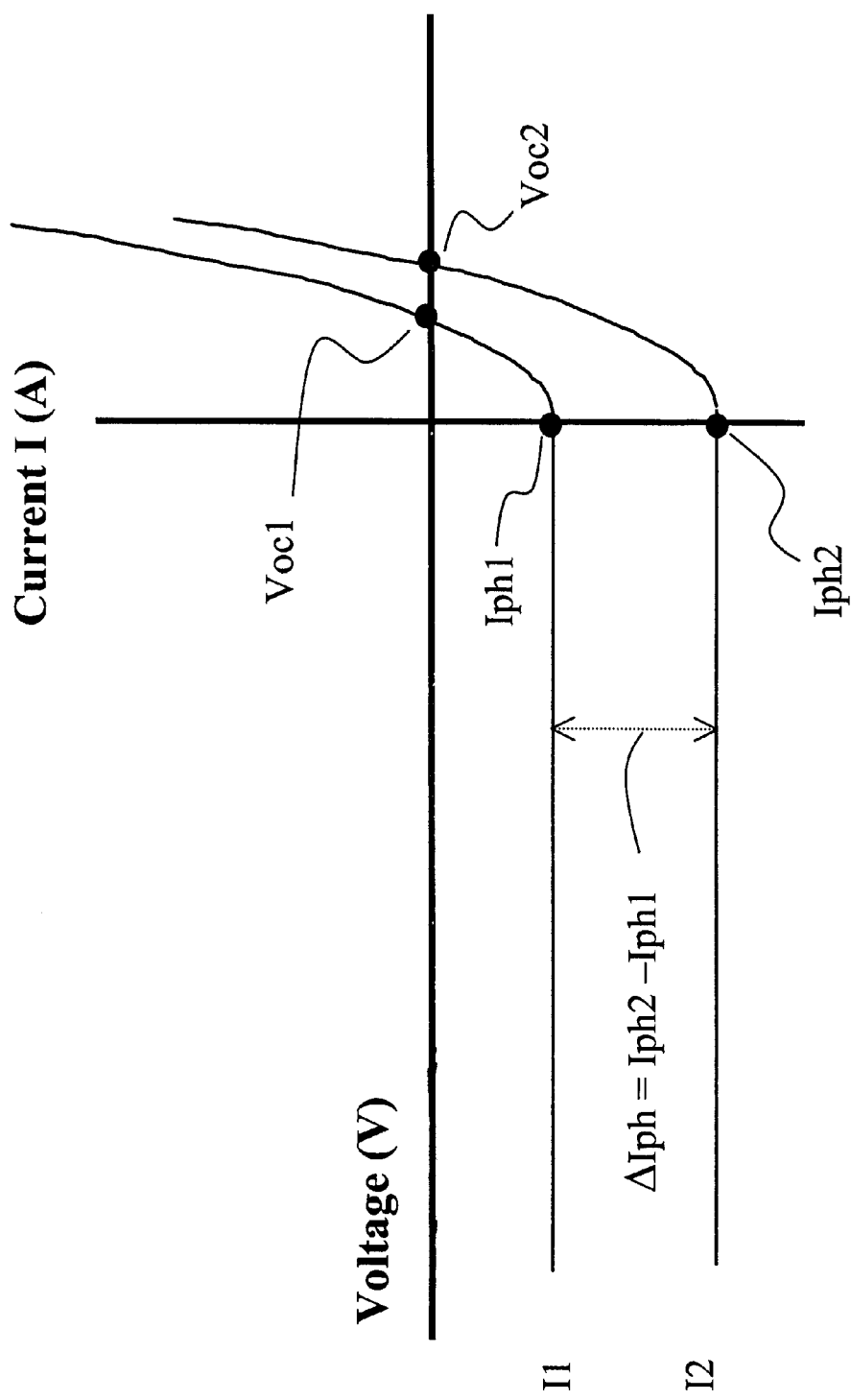
FIG. 2 is a plot showing two illustrative I-V curves corresponding to two measurement conditions for performing the current and voltage measurements used to determine the photodiode performance parameters, in accordance with an embodiment of the present invention.

Referring now to FIG. 2, there is shown a plot 200 of two illustrative I-V curves 11, 12, corresponding to two measurement conditions for performing the current and voltage measurements used to determine the photodiode performance parameters, in accordance with an embodiment of the present invention. In a preferred embodiment, as illustrated in FIG. 2, two separate I-V characterizations are performed during the same measurement session, to measure the four data points of interest.

Figure 3:
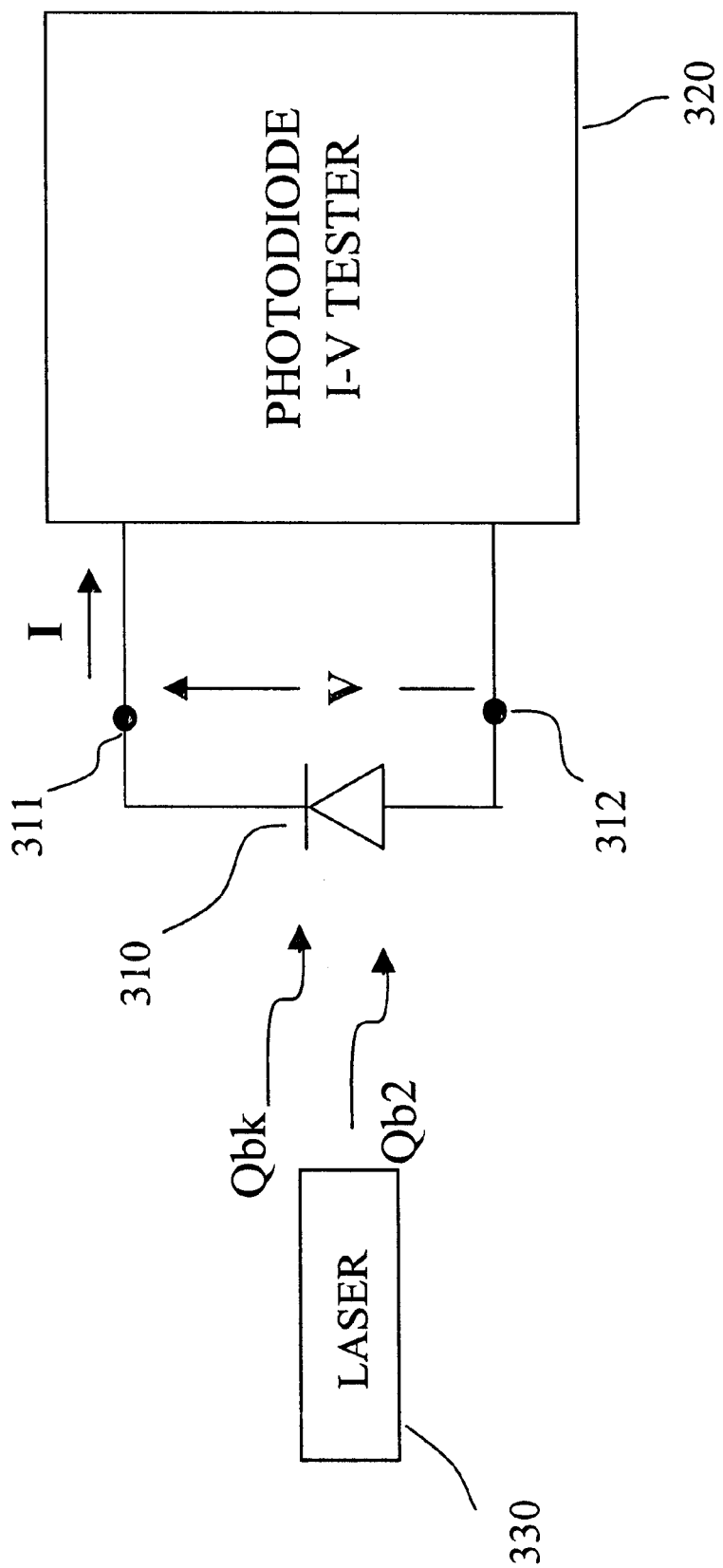
FIG. 3 is a schematic illustration of a photodiode testing system for testing a photodiode 310 in accordance with the present invention.

Referring now to FIG. 3, there is shown a schematic illustration of a photodiode testing system 300 for testing a photodiode 310 in accordance with the present invention. As illustrated, photodiode 310 has terminals 311, 312 to which are connected suitable testing equipment such as photodiode I-V tester 320. Tester 320 can measure short circuit current (i.e. Iph) and open-circuit voltage Voc under given illumination conditions. For example, tester 320 can vary the bias voltage V applied across photodiode 310 until zero current I is measured, to determine Voc. Likewise, tester 320 can short circuit terminals 311, 312 and measure the resulting short-circuit current Isc=Iph. As illustrated, background flux $Q_{BK}$ is always present, and a known photon flux $Q_{B2}$ may be selectively introduced using any light source having a known flux confined within a well-defined spectral band. For example, a laser 330 may be employed, which is under the control of tester 320. Alternatively, a black-body radiation source plus filter may be employed. In an embodiment, all light (including background flux $Q_{BK}$ and known photon flux $Q_{B2}$) is filtered with a passband filter (not shown) before reaching photodiode 310.

Referring once more to FIG. 2, the second I-V curve 12 measurement is performed under illumination by controlled photon flux $Q_{B2}$(plus the background flux $Q_{BK}$). In an embodiment, the controlled photon flux $Q_{B2}$ is selected so that the resulting Iph2 and Voc2 are larger enough than Iph1 and Voc1, respectively, so that meaningful differences between them may be measured. Thus, in one embodiment, the controlled photon flux $Q_{B2}$ is approximately equal to or within an order of magnitude greater than the background flux $Q_{BK}$. In a preferred embodiment, $Q_{B2}$ is within a range of approximately one to ten times the magnitude $Q_{BK}$. The four points of interest from the I-V curves are Iph1 and Voc1, from the first I-V curve I1, and Iph2 and Voc2, from the second I-V curve I2. These points can be measured electronically using minimal experimental data. In an embodiment, the dynamic-impedance-area product $R_0A$ is determined from these four data points. The quantum efficiency $\eta$ can be determined using only two of these points, i.e. Iph1 and Iph2. Therefore, in the course of measuring the data points necessary to determine electrical peformance parameter $R_0A$, data points needed to compute the optical performance parameter $\eta$ are already gathered. The specific detectivity $D^*$ can be derived directly from the two primary performance parameters.

Figure 4:
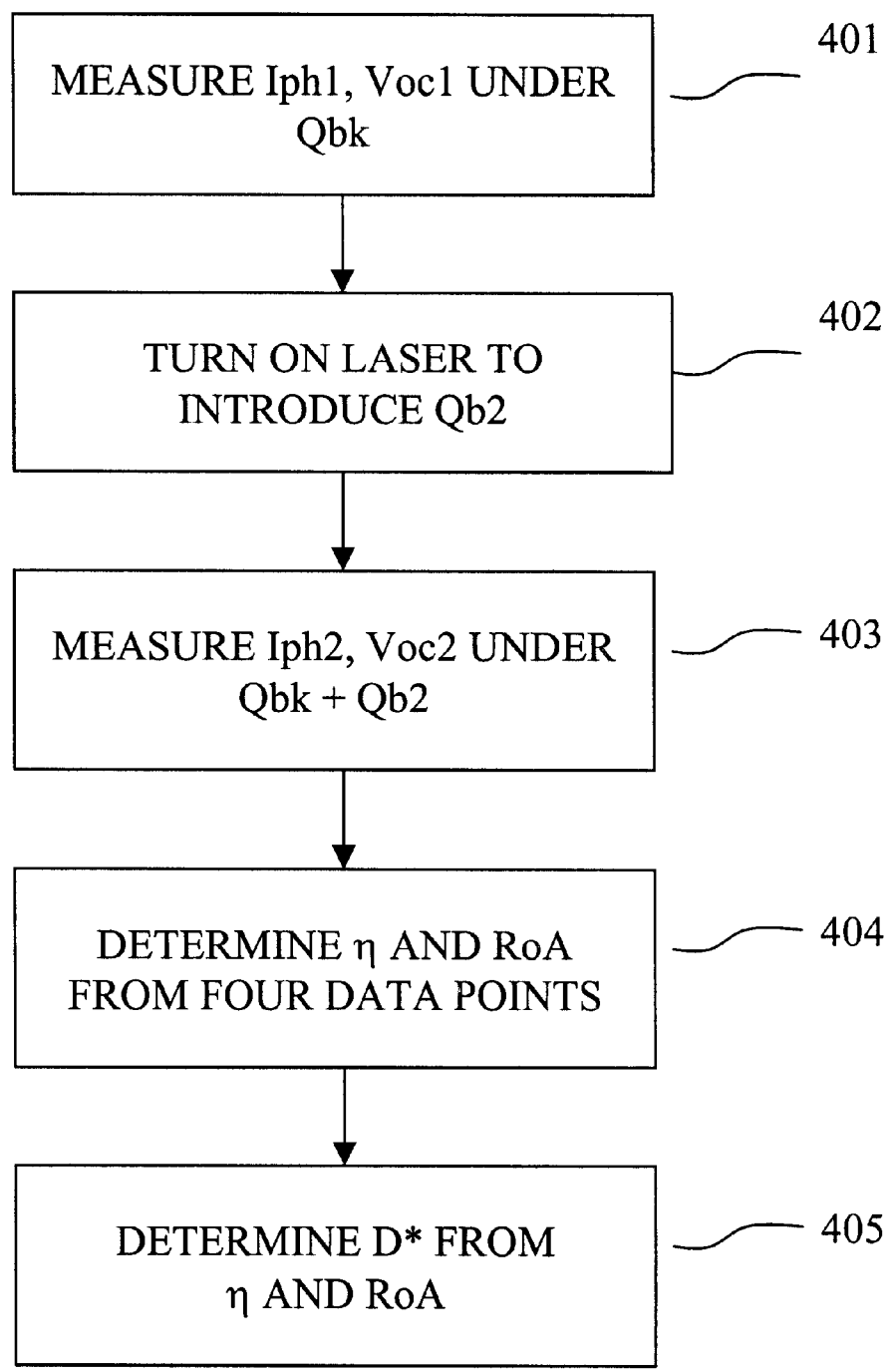
FIG. 4 is a flow chart illustrating the photodiode testing method of the present invention.

Referring now to FIG. 4, there is shown a flow chart 400 illustrating the photodiode testing method of the present invention. In the method of the present invention, first, under background illumination $Q_{BK}$ only (i.e., laser 330 is off), photocurrent Iph1 and open-circuit voltage Voc1 are measured with tester 320. I.e., the open-circuit voltage Voc1 and short-circuit current Iph1, which are two specific points of the first curve I1, are measured under the background photon flux of measurement environment, denoted as $Q_{BK}$ (step 401). This radiation represents an uncontrolled background photon flux, which is always present and to which the measurement apparatus is subject. $Q_{BK}$ does not need to be determined in order to determine the primary performance parameters.

In the same measurement session, controlled photon flux $Q_{B2}$ is introduced (step 402), so that the total illumination incident on photodetector 300 is increased from $Q_{BK}$ to ($Q_{BK}+Q_{B2}$). Photocurrent Iph2 and open-circuit voltage Voc2, which are points of second curve I2, are then measured under the new illumination condition (step 403). Thus, in a preferred embodiment, as illustrated in FIG. 2, two separate I-V characterizations are performed during the same measurement session, to measure the four data points of interest. As will be appreciated, the order of measurement of the four data points may vary in alternative embodiments. For example, as described above, the I-V measurements Iph1 and Voc1 for background photon flux $Q_{BK}$ (curve I1) may be performed, followed by the I-V measurements Iph2 and Voc2 made after photon flux $Q_{B2}$ is introduced. Alternatively, I measurements Iph1 and Iph2 may be made first, followed by V measurements for Voc1 and Voc2.

By definition, the photocurrents Iph1 and Iph2 are given by:

$$Iph1 = \eta q A_{OPT} Qbk$$

$$Iph2 = \eta q A_{OPT}(Qbk + Qb2) \tag{7}$$

The difference between these photocurrents ($\Delta$ Iph) represents the photocurrent contributions arising from the controlled radiation flux $Q_{BK}$ during the second measurement, because the contribution to the photocurrent from the uncontrolled photon flux of the measurement cancels out if the two photocurrents are subtracted from one another. Thus, because the radiation flux of the second measurement, $Q_{B2}$, is known, the external quantum efficiency $\eta$ can be computed from the difference in the photocurrent using the optical area A of the device:

$$\eta = \frac{\Delta Iph}{qAQ_{B2}} \text{ where } \Delta Iph = |Iph2 - Iph1| \tag{8}$$

In this manner, the optical properties (i.e., $\eta$) of the DUT can be determined in the course of measuring the electrical properties. Therefore, the next step of the method of the present invention is to determine quantum efficiency $\eta$ based on the measured data points Iph1 and Iph2 (step 402), and also based on area A and known photon flux $Q_{B2}$.

Next, electrical properties (i.e., $R_0A$) are determined using the open-circuit voltages Voc1 and Voc2 as well as the short circuit photocurrents Iph1 and Iph2. With these values experimentally determined, the diode equations for the respective measurements are coupled by only two unknowns: the ideality factor n and the saturation current $I_0$. By using two measurements of the current-voltage characteristics, either the ideality factor n or the saturation current can be uniquely determined, in accordance with the following transcendental equations and measurements:

$$\frac{1}{n} = \frac{kT}{qVoc1}\ln\left(\frac{Iph1}{I_0}+1\right) = \frac{kT}{qVoc2}\ln\left(\frac{Iph2}{I_0}+1\right) \qquad (9)$$

$$I_0 = \frac{Iph2}{\left[\exp\left(\frac{qVoc2}{nkT}\right)-1\right]} = \frac{Iph1}{\left[\exp\left(\frac{qVoc1}{nkT}\right)-1\right]} \qquad (10)$$

In particular, either n or $I_0$ may be determined by ascertaining the realistic intersection point of the curves described by the above Eqs. (9) or (10) (step 403).

Saturation current $I_0$ may thus be determined, given a value for n, using either the curve I1 or I2 measured I-V data points (step 404). Alternatively, other suitable mathematical techniques may be used to determine n and $I_0$, given Iph1, Iph2, Voc1, and Voc2. For example, the Eqs. (9) containing the $I_0$ term may be solved for $I_0$ using transcendental techniques or equivalently Eqs. (10) containing the ideality factor term n term may be solved. Once either $I_0$ or n is determined, it may be plugged back into either equation to solve for n or $I_0$ respectively.

Once the saturation current $I_0$ is known, $R_0A$ is determined from Eq. (2) above (step 405). As will be appreciated, the reliability of the estimate for $R_0A$ is enhanced by the experimental measurement of the ideality factor n. Thus, in the course of determining the primary electrical performance parameter $R_0A$ in accordance with the present invention, other performance parameters are, or may be, also determined. For example, saturation current $I_0$ and ideality factor n are calculated in order to calculate $R_0A$. Once n and $I_0$ are determined, or $R_0A$ is calculated, dynamic impedance $R_0$ may be easily determined, employing Eq. (2), or dividing $R_0A$ by A.

Finally, if desired, once external quantum efficiency $\eta$ and $R_0A$ are determined, the specific detectivity D* may be calculated, using Eq. (4). Therefore, using only four data points extracted from two separate measurements of the I-V characteristics of a photodiode, in the same measurement session, the primary performance parameters $\eta$ and $R_0A$, as well as the specific detectivity D*, of the photodiode 300 may be calculated. In an alternative embodiment, because $\eta$ and $R_0A$ are a function of the four data points Iph1, Voc1, Iph2, Voc2, instead of computing D* based on $\eta$ and $R_0A$, D* may be computed directly from the four data points, without computing $R_0A$ and $\eta$ as intermediate results. Other photodiode performance parameters, such as $I_0$, n, and $R_0$ may also be determined in the course of determining $R_0A$.

The method of the present invention may be used to expediently monitor devices for compliance to performance benchmarks, and may be used to determine photodetector performance in a high-volume manufacturing environment. For example, in one application, the method of the present invention may be employed to screen processed devices before proceeding to the next stage of photodiode manufacturing.

In an embodiment, therefore, the present invention provides a method for determining one or more photodiode performance parameters for a photodiode, including the primary optical performance parameter (quantum efficiency $\eta$), the primary electrical parameter (dynamic-impedance-area product $R_0A$), and the overall performance parameter (specific detectivity D*). The method involves first obtaining (e.g., by measuring) the four data points Iph1 and Voc1 (under a first illumination condition) and Iph2 and Voc2 (under a second illumination condition).

Then, either $R_0A$ or D* are determined as a function of the four data points. External quantum efficiency $\eta$ can also be determined as a function of the four data points or, to be more precise, as a function of only two of them, i.e. Iph1 and Iph2. D* can be computed based on $\eta$ and $R_0A$, or it may be computed directly from the four data points, without computing $R_0A$ and $\eta$ as intermediate results.

In an embodiment, the four data points are obtained by measuring these points under suitable illumination conditions with suitable open-circuit voltage and short-circuit current measuring and testing equipment. In one embodiment, the first illumination condition is simply the uncontrolled background illumination of the photodiode's local environment, and the second illumination condition is the background illumination plus the illumination introduced by an illumination laser introducing a known photon flux.

One advantage of the present invention is that a simple two-step (laser off, laser on) process, in the same measurement session, is sufficient to measure the four data points from which can be derived the photodiode performance parameters described above. There is no need to employ more complicated devices such as a chopper device, which is often utilized to produce a square wave light signal, the AC component of which is related to the known photon flux and the DC level of which is related to the background flux.

The present invention can also be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted as a propagated computer data or other signal over some transmission or propagation medium, such as over electrical wiring or cabling, through fiber optics, or via electromagnetic radiation, or otherwise embodied in a carrier wave, wherein, when the computer program code is loaded into and executed by a computer, the computer becomes an apparatus for practicing the invention. When implemented on a general-purpose microprocessor sufficient to carry out the present invention, the computer program code segments configure the microprocessor to create specific logic circuits to carry out the desired process.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving fill cognizance to equivalents in all respects.

What is claimed is:

1. A method for determining one or more photodiode performance parameters for a photodiode, the method comprising the steps of:
   (a) determining, for the photodiode, four data points Iph1, Voc1, Iph2, and Voc2, where Iph1 is a first short-circuit current, and Voc1 is a first open-circuit voltage, for the photodiode under a first illumination condition, and Iph2 is a second short-circuit current, and Voc2 is a second open-circuit voltage, for the photodiode under a second illumination condition; and (b) determining at least one photodiode performance parameter for the photodiode as a function of said four data points.

2. The method of claim 1, wherein the at least one photodiode performance parameter comprises the dynamic impedance at zero bias $R_0$, the saturation current $I_0$, and the ideality factor n.

3. The method of claim 1, wherein the at least one photodiode performance parameter comprises the dynamic-impedance-area product $R_0A$ of the photodiode and the specific detectivity $D^*$ of the photodiode, where $R_0$ is the dynamic impedance at zero bias and A is the junction area of the photodiode.

4. The method of claim 3, wherein the at least one photodiode performance parameter further comprises the external quantum efficiency $\eta$ of the photodiode and step (b) comprises the further step of determining the external quantum efficiency $\eta$ based on Iph1 and Iph2.

5. The method of claim 3, wherein the at least one photodiode performance parameter further comprises the external quantum efficiency $\eta$ of the photodiode and step (b) comprises the further steps of:

determining the external quantum efficiency $\eta$ based on Iph1 and Iph2;

determining $R_0A$ based on said four data points; and determining $D^*$ based on $R_0A$ and $\eta$.

6. The method of claim 1, wherein step (a) comprises the steps of:

measuring Iph1 and Voc1 in an environment having a background photon flux;

introducing a known photon flux; and measuring Iph2 and Voc2 in an environment having the background photon flux plus the known photon flux.

7. The method of claim 6, wherein the known photon flux has a magnitude from approximately one to ten times the magnitude of the background flux.

8. The method of claim 1, wherein the at least one photodiode performance parameter comprises the dynamic-impedance-area product $R_0A$ of the photodiode, where $R_0$ is the dynamic impedance at zero bias and A is the junction area of the photodiode.

9. The method of claim 1, wherein the at least one photodiode performance parameter comprises the specific detectivity $D^*$ of the photodiode.

10. An apparatus for determining one or more photodiode performance parameters for a photodiode, comprising:

(a) means for determining, for the photodiode, four data points Iph1, Voc1, Iph2, and Voc2, where Iph1 is a first short-circuit current, and Voc1 is a first open-circuit voltage, for the photodiode under a first illumination condition, and Iph2 is a second short-circuit current, and Voc2 is a second open-circuit voltage, for the photodiode under a second illumination condition; and (b) means for determining at least one of an electrical performance parameter and the specific detectivity $D^*$ for the photodiode as a function of said four data points.

11. A computer data signal transmitted via a propagation medium, the computer data signal comprising a plurality of instructions for determining one or more photodiode performance parameters of a photodiode, wherein the plurality of instructions, when executed by a processor, cause the processor to perform the step of:

(a) determining at least one at least one photodiode performance parameter for the photodiode as a function of four data points Iph1, Voc1, Iph2, and Voc2, where Iph1 is a first short-circuit current, and Voc1 is a first open-circuit voltage, for the photodiode under a first illumination condition, and Iph2 is a second short-circuit current, and Voc2 is a second open-circuit voltage, for the photodiode under a second illumination condition.

12. The computer data signal of claim 11, wherein the at least one photodiode performance parameter comprises the dynamic impedance at zero bias $R_0$, the saturation current $I_0$, and the ideality factor n.

13. The computer data signal of claim 11, wherein the at least one photodiode performance parameter comprises the dynamic-impedance-area product $R_0A$ of the photodiode and the specific detectivity $D^*$ of the photodiode, where $R_0$ is the dynamic impedance at zero bias and A is the junction area of the photodiode.

14. The computer data signal of claim 13, wherein the at least one photodiode performance parameter further comprises the external quantum efficiency $\eta$ of the photodiode and step (a) comprises the further step of determining the external quantum efficiency $\eta$ based on Iph1 and Iph2.

15. The computer data signal of claim 13, wherein the at least one photodiode performance parameter further comprises the external quantum efficiency $\eta$ of the photodiode and step (a) comprises the further steps of:

determining the external quantum efficiency $\eta$ based on Iph1 and Iph2;

determining $R_0A$ based on said four data points; and determining $D^*$ based on $R_0A$ and $\eta$.

16. The computer data signal of claim 11, wherein Iph1 and Voc1 have been measured in an environment having a background photon flux and Iph2 and Voc2 have been measured in an environment having the background photon flux plus a known photon flux introduced by a light source.

17. A computer-readable medium having stored thereon a plurality of instructions for determining one or more photodiode performance parameters of a photodiode, wherein the plurality of instructions, when executed by a processor, cause the processor to perform the step of:

(a) determining at least one at least one photodiode performance parameter for the photodiode as a function of four data points Iph1, Voc1, Iph2, and Voc2, where Iph1 is a first short-circuit current, and Voc1 is a first open-circuit voltage, for the photodiode under a first illumination condition, and Iph2 is a second short-circuit current, and Voc2 is a second open-circuit voltage, for the photodiode under a second illumination condition.

18. The computer-readable medium of claim 17, wherein the at least one photodiode performance parameter comprises the dynamic impedance at zero bias $R_0$, the saturation current $I_0$, and the ideality factor n.

19. The computer-readable medium of claim 17, wherein the at least one photodiode performance parameter comprises the dynamic-impedance-area product $R_0A$ of the photodiode and the specific detectivity $D^*$ of the photodiode, where $R_0$ is the dynamic impedance at zero bias and A is the junction area of the photodiode.

20. The computer-readable medium of claim 19, wherein the at least one photodiode performance parameter further comprises the external quantum efficiency $\eta$ of the photodiode and step (b) comprises the further step of determining the external quantum efficiency $\eta$ based on Iph1 and Iph2.

21. The computer-readable medium of claim 19, wherein step (a) comprises the further steps of:

determining the external quantum efficiency η based on Iph1 and Iph2;

determining $R_0A$ based on said four data points; and determining D* based on $R_0A$ and η of determining the external quantum efficiency η based on Iph1 and Iph2, further wherein Iph1 and Voc1 have been measured in an environment having a background photon flux and Iph2 and Voc2 have been measured in an environment having the background photon flux plus a known photon flux introduced by a light source.

22. The apparatus of claim 10, wherein the at least one photodiode performance parameter comprises the dynamic impedance at zero bias $R_0$, the saturation current $I_0$, and the ideality factor n.

23. The apparatus of claim 10, wherein the at least one photodiode performance parameter comprises the dynamic-impedance-area product $R_0A$ of the photodiode and the specific detectivity D* of the photodiode, where $R_0$ is the dynamic impedance at zero bias and A is the junction area of the photodiode.

24. The apparatus of claim 23, wherein the at least one photodiode performance parameter further comprises the external quantum efficiency η of the photodiode and means (b) comprises means for determining the external quantum efficiency η based on Iph1 and Iph2.

25. The apparatus of claim 23, wherein the at least one photodiode performance parameter further comprises the external quantum efficiency η of the photodiode and means (a) further comprises:

means for determining the external quantum efficiency η based on Iph1 and Iph2;

means for determining $R_0A$ based on said four data points; and means for determining D* based on $R_0A$ and η.

26. The apparatus of claim 10, wherein Iph1 and Voc1 have been measured in an environment having a background photon flux and Iph2 and Voc2 have been measured in an environment having the background photon flux plus a known photon flux introduced by a light source.

27. A method for determining one or more photodiode performance parameters for a photodiode, the method comprising the step of determining at least one at least one photodiode performance parameter for the photodiode as a function of four data points Iph1, Voc1, Iph2, and Voc2, where Iph1 is a first short-circuit current, and Voc1 is a first open-circuit voltage, for the photodiode under a first illumination condition, and Iph2 is a second short-circuit current, and Voc2 is a second open-circuit voltage, for the photodiode under a second illumination condition.

28. The method of claim 27, wherein the at least one photodiode performance parameter comprises the dynamic impedance at zero bias $R_0$, the saturation current $I_0$, and the ideality factor n.

29. The method of claim 27, wherein the at least one photodiode performance parameter comprises the dynamic-impedance area product $R_0A$ of the photodiode and the specific detectivity D* of the photodiode, where $R_0$ is the dynamic impedance at zero bias and A is the junction area of the photodiode.

30. The method of claim 29, wherein the at least one photodiode performance parameter further comprises the external quantum efficiency η of the photodiode and the step of determining comprises the further step of determining the external quantum efficiency η based on Iph1 and Iph2.

31. The method of claim 29, wherein the at least one photodiode performance parameter further comprises the external quantum efficiency η of the photodiode and the step of determining comprises the further steps of:

determining the external quantum efficiency η based on Iph1 and Iph2;

determining $R_0A$ based on said four data points; and determining D* based on $R_0A$ and η.

32. The method of claim 27, wherein Iph1 and Voc1 have been measured in an environment having a background photon flux and Iph2 and Voc2 have been measured in an environment having the background photon flux plus a known photon flux introduced by a light source.

* * * * *